Oct. 4, 1960

N. RAVER 2,955,214

BISTABLE CIRCUIT

Filed March 4, 1958

Inventor
NORMAN RAVER

By William E. Gleaver
Agent 2,955,214

BISTABLE CIRCUIT

Norman Raver, East Orange, N.J., assignor to International Telephone and Telegraph Corporation, Nutley, N.J., a corporation of Maryland Filed Mar. 4, 1958, Ser. No. 719,082

9 Claims. (Cl. 307—88.5)

This invention relates to bistable circuits and in particular to a bistable circuit having a relatively high power output.

The bistable circuit, popularly called flip flops, which are now commonly found in many data processing and control circuit arrangements are generally some version of the original Eccles-Jordan circuit. These circuits comprise a pair of tubes or transistors having the output element of a first tube or transistor interconnected with the control element of the second tube or transistor by a network of resistances and capacitances. The resistance-capacitance time constant developed in the network enables a sharp trigger pulse to drive both electron conducting devices below cut off and permits the capacitance discharge "race" to be won by the tube or transistor which had been non-conducting when the circuit received the trigger pulse. Therefore, one of the tubes or transistors is conducting at any instant and the other tube or transistor is cut off.

The flip flops, described above, have some inherent disadvantage for certain operations. For instance, because the transition from one stable state to another depends upon a capacitance discharge "race," there is a certain loss of time in the transition. Secondly, these flip flops usually have to be coupled to some type of buffer circuit in order to obtain large power outputs. This becomes apparent if we consider that generally speaking in data processing arrangements there are switching circuits which constitute the "decision" circuits and static logic circuits which develop sequential signals. An example of such an arrangement would be a set of counting flip flop coupled to a diode decoding matrix which in turn is coupled to other flip flops. In order to drive the logic circuits, such as the above diode decoding matrix, it is necessary to develop suitable power at some impedance level. Obviously, the most efficient arrangement is one in which there is impedance match of the logical circuits. Usually an amplifier is added to the output of the flip flops, but, since the output impedance of the driving amplifier is restricted, effecting an impedance match is difficult. Moreover, the voltage level required for driving the logical circuits, such as the diode decoding matrix, puts further restrictions on the amplifier design especially with respect to efficiency. The addition of the amplifier to the flip flops provides some impedance match and provides for a reasonable output gain, but it is apparent that an arrangement which might provide for proper impedance matching and proper voltage level requirements would be highly desirable.

It is therefore an object of this invention to provide an improved bistable circuit.

It is a further object of this invention to provide an improved bistable circuit which is not dependent on a sharp trigger pulse.

It is a further object of this invention to provide an improved bistable circuit which is capable of providing large power outputs with high operation efficiencies.

It is a further object of the present invention to provide a plurality of bistable devices arranged to form a binary counter.

In accordance with a main feature of the present invention there is provided a pair of symmetrically coupled PNP-NPN type transistors having a control gate coupled to the respective base inputs of the transistors.

In accordance with another main feature operating in conjunction with the above feature the present invention provides an alternating current source coupled to one input of the control gate and a control signal source coupled to another input of the control gate to permit the alternating current to be fed to the respective base element when the gate is opened by the control signal, thereby enabling the two transistors to conduct in a push-pull operation, representing one of the two stable states of the bistable circuit.

In accordance with another main feature, the present invention provides a transformer being coupled to the outputs of the two transistors to produce an amplification of the outputs and provides rectification means to provide two direct current outputs having a positive and negative polarity.

In accordance with another feature working in conjunction with the above features, the present invention provides a feedback circuit from each of the direct current outputs to the control signal input to enable the bistable circuit to conduct as long as the direct current output is not terminated.

The above mentioned and other features and objects of this invention will become more apparent by reference to the following description taken in conjunction with the accompanying drawings, in which.

Figure 1:
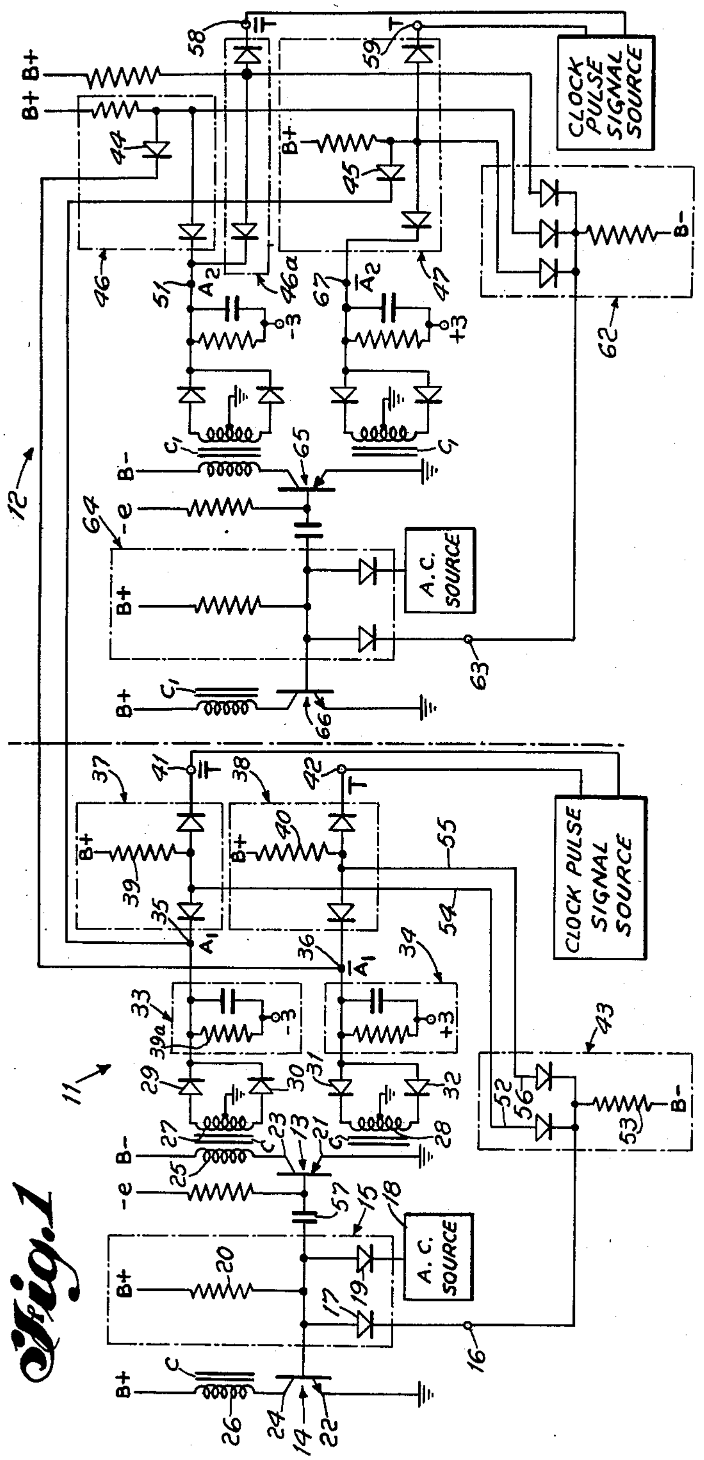
Fig. 1 is a schematic diagram of a two stage binary counter in accordance with the invention.

In Fig. 1 there is a first counter stage bistable circuit 11 coupled to a second counter stage bistable circuit 12. In the bistable circuit 11 there is a pair of transistors, a PNP type transistor 13 and an NPN type transistor 14. The base connection of these two transistors are coupled to a gating circuit 15. The gating circuit 15 has a control input lead 16 including a diode 17 and an alternating current source input lead 18 including a diode 19. The common connection of the two base elements and the diodes is coupled to a resistor 20 which is series coupled to B+. The emitter elements 21 and 22, respectively, of each transistor 13 and 14 are respectively connected to ground. The collector elements 23 and 24 of the transistors 13 and 14 are respectively coupled to the primary transformer windings 25 and 26. The primary windings 25 and 26 are coupled to the same core as the secondary windings 27 and 28 as indicated in Fig. 1 by the core designated C. The secondary windings 27 and 28 are center tapped to ground. The secondary winding 27 has a pair of diodes 29 and 30 connected in parallel across the terminals of the winding and biased in a forward direction to the center ground tap. The secondary winding 28 has a pair of diodes 31 and 32 connected in parallel across the terminals of the winding and biased in a forward direction away from the center ground tap. Each of the last-mentioned parallel connections of the secondary windings 27 and 28 is respectively connected to a parallel resistance-capacitance circuit 33 and 34. By way of illustration the parallel resistance-capacitance circuit 33 is connected to a minus 3 volts reference and the parallel resistance-capacitance circuit 34 is connected to a plus 3 volts reference. The positive direct current output terminal 35 is connected to the parallel resistance-capacitance circuit 33 while the negative direct current output terminal 36 is connected to the parallel resistance-capacitance circuit 34. The output terminals 35 and 36 are respectively further coupled to one input of the respective gating circuits 37 and 38. Each of the gating circuits 37 and 38 respectively are coupled to B+ through the respective associated resistances 39 and 40 and each gating circuit 37 and 38 respectively has a second input terminal at 41 and 42. The outputs of the gating circuits 37 and 38 are respectively connected to the input of an "or" gate 43. The output of the "or" gate 43 is coupled to the control input terminal 16. The components of the second stage 12 are identical except that there are two additional inputs 44 and 45 to respectively condition "on" the "and" gates 46 and 47 which are the counterparts of the "and" gates 37 and 38 in the first stage 11. In addition there is a third "and" gate 46a which is coupled in parallel to the output 51. The positive direct current output terminal 35 is connected to the input terminal 45 while the negative direct current output terminal 36 is coupled to the input terminal 44.

Figure 2:
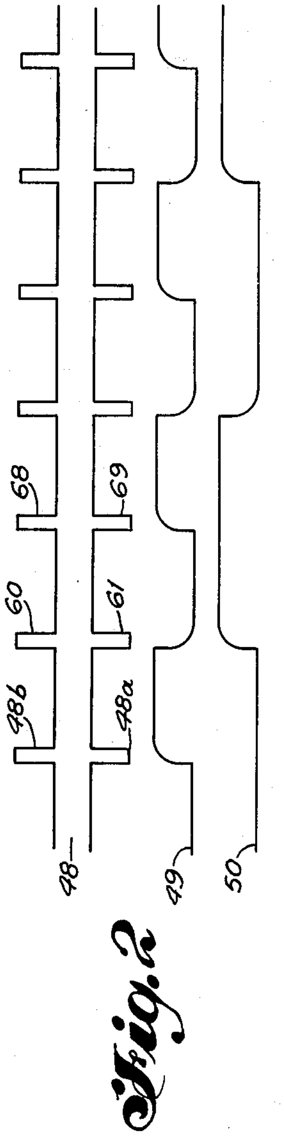
Fig. 2 is a graph of the clock pulse train and the output pulses of the two stages shown in a relative time relation.

In Fig. 2 the waveform 48 shows the clock pulse train having a negative and positive clock pulse for each time increment. The waveform 49 shows the output pulse from the output terminal 35 and waveform 50 shows the output pulse from the output terminal 51 of the second stage.

Considering Fig. 1 in connection with the operation of the invention, there is a clock pulse train, such as that shown by the waveforms 48, being fed to the terminals 41 and 42 of the gates 37 and 38. The terminal 41 receives the negative pulses of the clock train such as 48a of Fig. 2, and the terminal 42 receives the positive pulses such as 48b of Fig. 2. The two states of the bistable circuit 11 are the first state, when the transistors 13 and 14 are amplifying the alternating current input; and the second state, when the transistors 13 and 14 are substantially non-conducting. Assuming the transistors 13 and 14 are non-conducting, or in the second stable state, the point 35 is at a substantially negative potential with respect to ground. The point 35 is at this substantially negative potential because of the resistor divider network including the resistors 39, 39a and 53. With point 35 being at a substantially negative potential, the input 52 of the gate 43 is likewise at a substantially negative potential. During this same time the point 36 is at a positive potential with respect to ground by proper proportioning of the values of the resistors, particularly 40 and 53. Although there is some electron flow from the —B reference potential of the gate 43 to the B+ reference potential of gate 38, the output of the gate 43 is not lifted to a sufficiently high positive potential to open the gate 15. When the clock pulse train 48 is passed to the terminals 41 and 42, the negative pulses at 41 continue to hold the output voltage from gate 37 negative; therefore, the input terminal 52 remains at a substantially negative potential. When the positive pulses are applied to the terminal 42, the output voltage from the gate 38 is lifted to the peak of the positive potential pulse which in turn lifts the potential of the output of gate 43 by increased conduction across the resistance 53. With the input potential of the gate 43 lifted to a substantially high potential, the gate 15 is opened to permit the alternating current to be effectively received at the transistors 13 and 14. Prior to the change of the potential level at the gate 43 by the clock pulses, the output of gate 15 was held at a substantially negative potential. With the gate 15 being held at this substantially negative potential, the alternating current which was being applied to the base elements of each of the transistors 13 and 14 was blocked at diode 19, which subsequently became unblocked.

With the gate 15 open as described above, the alternating current is amplified by the transistors 13 and 14 and the PNP transistor 13 conducts during the negative half of the cycle while the NPN transistor 14 conducts during the positive half of the A.C. cycle to provide a push-pull operation of these symmetrically coupled transistors. The primary windings 25 and 26 are coupled to the same core as the secondary windings 27 and 28. With this common coupling of the transformer windings and the parallel circuit connection of the diodes 29 through 32 across the two secondary windings 27 and 28, there are provided respectively two direct current outputs at 35 and 36, with the output at 35 being positive and the output at 36 being negative. These two direct current outputs will continue as long as the transistors are conducting and amplifying the alternating current input. By coupling the outputs at 35 and 36 through the connecting leads 54 and 55 to the OR gate 43, there is provided a feedback arrangement to the control gate 15. In other words, with the transistors amplifying the alternating current input and therefore providing a positive output at 35 when the negative clock pulse at 41 terminates, the input lead 52 of the OR gate 43 will remain at the high potential of 35 and therefore lift or hold the gate 43 at the high potential that originally opened the gate 15. During this same conducting operation, as stated before, the output terminal 36 is held negative because there is substantial electron flow across the RC circuit 34 in the direction of the +3 reference voltage. Since the output terminal 36 is held negative, the gate 38 is likewise negative and, therefore, the input lead 56 of the gate 43 appears with a negative potential while the transistors are conducting.

At the time that the next pair of clock pulses arrives at the terminals 41 and 42, the negative pulse at 41 will cause the gate 37 to become negative and therefore render the input lead 52 negative, while the positive pulse received at 42 will fail to lift the potential of the gate 38 since it will be held negative by the conduction across the RC circuit 34 and, therefore, the input lead 56 will remain negative. With the inputs 52 and 56 of the gate 43 negative, the gate 43 renders the input terminal 16 negative and hence the gate 15 becomes closed. When the gate 15 becomes closed, the bistable device 11 reverts to the second stable state which was initially described, wherein the alternating current is no longer effectively applied to the base elements of the transistors 13 and 14. During this second stable state, or "off" state, with the potential of the gate 15 being held substantially negative, there normally would be heavy direct current conduction through the transistor 13 since a PNP type transistor is responsive to a negative voltage input. By inserting the capacitor and resistance circuit 57 as shown, the direct current is blocked and hence there is no dissipation of power in the transformer during this "off" condition.

Considering the operation of the second bistable circuit 12 of the counter in connection with the operation of the first bistable circuit 11, the "and" gate 46 of the bistable circuit 12 is connected to be further conditioned by the output at 36 of the bistable circuit 11. During the time that the transistors 13 and 14 are conducting, the terminal 35 is at a positive potential. The "and" gate 46a has one of its two inputs conditioned negatively since 51 is negative. The "and" gate 46 of the bistable device 12 has one of its two inputs conditioned negatively by 51, while the "and" gate 47 has two of its three inputs conditioned positively by 67 and 35. The clock pulse train 48 is likewise applied to the terminals 58 and 59 of the bistable device 12 at the same time that these clock pulses are applied to the terminals 41 and 42 of the bistable circuit 11. At the time that the second clock pulses, graphically depicted at 60 and 61 of Fig. 2, arrive at the terminals 58 and 59, the negative pulse 61 continues to render the gate 46a negative. However, gate 46 at this time is positive during the clock period because it is connected to point 36 ($A_1$) and point 51 ($A_2$) which is also now positive. The positive pulse 60 conditions the third input to the "and" gate 47 positive and thereby lifts the potential of the "or" gate 62 to a positive potential. With the "or" gate 62 being lifted to a positive potential, the input 63 of the gate 64 is likewise lifted to a positive potential and, therefore, the gate 64 is opened. With the opening of the gate 64, the alternating current input to the transistors 65 and 66 becomes effective, and these transistors amplify the alternating current input in a fashion similar to that described in connection with the bistable circuit 11. The output at 51 will remain a positive direct current voltage and the ouput at 67 will remain a negative direct current voltage as long as the transistors 65 and 66 are conducting and amplifying the alternating current input.

Examining the waveforms of Fig. 2, it becomes clear that at the third clock pulse, depicted at 68 and 69, the bistable device 12 will not be affected and the bistable device 11 will be transferred to its first stable state. This is true because in the "off" state of the bistable circuit 11, the terminal 36 was positive rendering one input of the gate 46 positive. Since the bistable circuit 12 is conducting at the third clock pulse time, the terminal 51 is positive rendering the gate 46 positive and independent of the clock pulses since they are not applied thereto.

It becomes clear that a counter of any number of stages according to well-known logic may be built by duplicating the inputs to the counterparts of the "and" gates 46, 46*a* and 47 which belong to the added stages, and thereby providing an output in accordance with well-known binary counting arrangements. The invention has been described using a symmetrically coupled PNP and NPN type transistors. However, a pair of transistors, both of the same type, might be used with an inverter means coupled therebetween to provide for the push-pull arrangement which renders the invention operative with a high efficiency. It also becomes clear upon examination of the invention that the invented circuit provides a means for having a bistable circuit with high power amplification because the alternating current input feature makes step-up or or step-down transformers possible; that the inventive circuit provides high efficiency because of the push-pull arrangement; and that the inventive circuit provides a means of accomplishing a bistable condition with a voltage pedestal rather than sharp trigger pulses. The accomplishment of the changing of the bistable conditions with a voltage pedestal instead of a sharp trigger pulse is apparent in the operation of the circuit since it is only necessary to accomplish a voltage shift at the proper "and" gate to accomplish the subsequent transition from one of the bistable states to the second bistable state.

While I have described above the principles of my invention in connection with specific apparatus, it is to be clearly understood that this description is made only by way of example and not as a limitation to the scope of my invention as set forth in the objects thereof and in the accompanying claims.

I claim:

1. A bistable circuit comprising first and second transistors operating in two stable states, a gating circuit having first and second input means, a clock signal source of regular and opposite polarity pulses coupled to said first gating input means, an alternating current signal source of radio frequency signals coupled to said second gating input means, first circuitry means coupling said transistors to said gating circuit to render, when said gating circuit is open, said first and second transistors respectively responsive to the negative and positive halves of said alternating current signal input, second circuitry means connecting the respective outputs of said transistors to said first gating input means to render said transistors conducting after receiving a first clock signal and non-conducting after receiving a second clock signal, said first gating input means including second, third and fourth gating circuits, said second gating circuits being an "Or" gate and said third and fourth gating circuits being "And" gates.

2. A bistable circuit according to claim 1, wherein said gating circuit includes a pair of diodes coupled in parallel to one terminal of a resistance element which has its other terminal opposite the common connection, coupled to a reference voltage.

3. A bistable circuit according to claim 1, wherein said first circuitry means includes a capacitor coupled in series to the base of one of said transistors and a resistance coupled in parallel to this last-mentioned common connection to block the direct current to said transistor to prevent unnecessary power dissipation when said gating circuit is closed.

4. A bistable circuit according to claim 1, wherein said clock signal source transmits a clock pulse train having simultaneously positive and negative characteristics with the positive portion thereof coupled to said third gating circuit and negative portion thereof coupled to the fourth gating circuit.

5. A bistable circuit according to claim 4, wherein the output means of each of said transistors includes a single transformer having a pair of primary and secondary windings, said secondary windings each being coupled to an associated rectifying means, the output of said first secondary winding rectifying means being coupled to said third gating circuit and said second secondary winding rectifying means being coupled to said fourth gating means.

6. A bistable circuit comprising a first gating circuit having a pair of diodes coupled in parallel to a resistance which in turn is coupled to a first reference voltage, a PNP and an NPN transistor symmetrically coupled by said first gating circuit, a radio frequency signal source coupled to the input of one of said first gating diodes, an "or" gate comprising a first and second diode coupled in parallel to a resistance which in turn is coupled to a second reference voltage, the output of said "or" gate circuitry coupled to the input of the other of said first gating circuit diodes, a second and third "and" gate each having a pair of diodes coupled in parallel to a respective resistance each of which is respectively coupled to a reference voltage, a transformer having first and second primary windings and first and second secondary windings, said first primary winding being coupled to the collector element of said PNP transistor and to a negative reference potential, said second primary winding being coupled to the collector element of said NPN transistor and a positive reference potential, said first secondary winding coupled to rectifying means to produce a positive direct current output therefrom, said second secondary winding coupled to rectifying means to produce a negative direct current output therefrom, a source of clock pulse signals to transmit a clock pulse train having simultaneously pairs of clock pulses respectively having positive and negative characteristics, said second "and" gate having the input to one of its diodes coupled to said positive direct current output and the other of its diodes coupled to the negative portion of said clock train and said third "and" gate having one of its diodes coupled to said negative direct current output and the other of its diodes coupled to the positive portion of said clock pulse to render said transistors conducting in accordance with the radio frequency signal after having received a first pair of clock pulses and non-conducting after having received a second pair of clock pulses.

7. A binary counter arrangement comprising a plurality of stages, each of said stages including first and second transistors, a gating circuit coupled to the control elements of each of said transistors, an alternating current signal source coupled to said gating circuit, a control signal input means coupled to said gating circuit to render said gating circuit open and closed with the application of control signals, said transistors respectively conducting in response to the negative and positive halves of said alternating current signal input when said gating circuit is opened, first and second counter output means coupled to the output means of each of said transistors to provide simultaneously a positive and a negative direct current output when said transistors are conducting, a source of clock pulse signals, a second and third gating means respectively coupling said clock pulse signals with said respective counter output mean, second circuitry means connecting the respective second and third gating output means to said control signal input means to provide a feedback signal to said control signal input means when said transistors are conducting, said transistors being conducting and non-conducting in response to proper conditioning of said second and third gating means, third circuitry means coupling the first counter output means of a lower stage to each second gating means of each higher ordered stage, and fourth circuitry means coupling the second counter output means of said lower stage to the first gating means of higher ordered stage to render a higher ordered stage conducting and non-conducting in response to a transition from conducting to non-conducting of said next lower ordered stages.

8. A binary counter arrangement according to claim 7, wherein said transistors of each stage are symmetrically coupled PNP and NPN transistors.

9. A binary counter arrangement according to claim 7, wherein said control signal input means includes a gating circuit having different predetermined numbers of inputs for each stage of said counter in accordance with its numbered order.

References Cited in the file of this patent

UNITED STATES PATENTS

| | | |
|---|---|---|
| 2,756,329 | Lubkin | July 24, 1956 |
| 2,782,267 | Beck | Feb. 19, 1957 |
| 2,820,897 | Dean et al. | Jan. 21, 1958 |

OTHER REFERENCES

Richards: Arithmetic Operations in Digital Computers, 1955, pages 46 and 47.